United States Patent
O'Brien

(10) Patent No.: US 8,400,338 B2
(45) Date of Patent: Mar. 19, 2013

(54) COMPENSATING FOR HARMONIC DISTORTION IN AN INSTRUMENT CHANNEL

(75) Inventor: David O'Brien, Toronto (CA)

(73) Assignee: Teradyne, Inc., North Reading, MA (US)

( * ) Notice: Subject to any disclaimer, the term of this patent is extended or adjusted under 35 U.S.C. 154(b) by 134 days.

(21) Appl. No.: 13/049,286

(22) Filed: Mar. 16, 2011

(65) Prior Publication Data

US 2011/0227767 A1    Sep. 22, 2011

Related U.S. Application Data

(63) Continuation-in-part of application No. 12/724,894, filed on Mar. 16, 2010, now abandoned, which is a continuation of application No. 11/647,836, filed on Dec. 29, 2006, now abandoned.

(51) Int. Cl.
*H03M 1/06* (2006.01)

(52) U.S. Cl. .......................................... 341/118; 341/94

(58) Field of Classification Search .................. 341/118, 341/94, 106; 702/85; 708/275, 276
See application file for complete search history.

(56) References Cited

U.S. PATENT DOCUMENTS

| | | |
|---|---|---|
| 4,612,533 A | 9/1986 | Evans |
| 4,868,869 A | 9/1989 | Kramer |
| 4,991,218 A | 2/1991 | Kramer |
| 5,047,769 A | 9/1991 | Engeler et al. |
| 5,235,410 A | 8/1993 | Hurley |
| 5,349,546 A | 9/1994 | Sharman |
| 6,271,781 B1 | 8/2001 | Pellon |
| 6,356,129 B1 | 3/2002 | O'Brien et al. |
| 6,463,093 B1 | 10/2002 | Komara et al. |
| 6,504,935 B1 | 1/2003 | Jackson |
| 6,522,983 B1 | 2/2003 | Dobos et al. |
| 6,807,316 B2 | 10/2004 | Enomoto |
| 6,854,165 B1 | 2/2005 | Parker |
| 6,885,323 B2 | 4/2005 | Batruni |
| 6,954,165 B2 | 10/2005 | Mallinson |
| 7,084,722 B2 | 8/2006 | Goyette |
| 7,171,002 B2 | 1/2007 | Coats et al. |
| 7,545,224 B2 | 6/2009 | Chow et al. |
| 2008/0109503 A1 | 5/2008 | Gross et al. |
| 2008/0158026 A1 | 7/2008 | O'Brien |

(Continued)

FOREIGN PATENT DOCUMENTS

| | | |
|---|---|---|
| EP | 1 339 169 | 8/2003 |
| EP | 1 647 810 | 4/2006 |

(Continued)

OTHER PUBLICATIONS

First Office Action in Chinese Application No. 200780048798.5, dated Jun. 2, 2010 (with English translation).

(Continued)

*Primary Examiner* — Joseph Lauture
(74) *Attorney, Agent, or Firm* — Fish & Richardson P.C.

(57) ABSTRACT

Automatic test equipment (ATE) includes circuitry configured to pass a signal in a channel of the ATE, and memory configured to store a first and second correction values. A first correction value is based on a first version of the signal, where the first correction value is for use in correcting static non-linearity associated with the channel. A second correction value is based on a second version of the signal, where the second correction value is for use in correcting dynamic non-linearity associated with the channel. Digital signal processing logic is configured to use the first correction value, the second correction value, and the signal in order to compensate for harmonic distortion from the channel.

21 Claims, 8 Drawing Sheets

U.S. PATENT DOCUMENTS

2008/0252384 A1  10/2008  Chow et al.
2010/0235126 A1* 9/2010  O'Brien .................. 702/85

FOREIGN PATENT DOCUMENTS

WO  WO2008/042254  4/2008
WO  WO 2008/083269  7/2008

OTHER PUBLICATIONS

Reply in response to First Office Action in Chinese Application No. 200780048798.5, filed on Dec. 7, 2010 (including English-language machine translation of response and claim amendments).
Second Office Action in Chinese Application No. 200780048798.5, dated Dec. 23, 2011 (with English summary of rejections).
Reply in response to Second Office Action in Chinese Application No. 200780048798.5, filed on Jan. 19, 2012 (including English-language machine translation of response and claim amendments).
International Preliminary Report on Patentability in Application No. PCT/US2007/089031, dated Jul. 9, 2009.
International Search Report and Written Opinion in Application No. PCT/US2007/089031, dated May 23, 2008.
Written Opinion in Singapore Application No. 200903540-3, dated Oct. 1, 2010.
Action and Response History in U.S. Appl. No. 12/724,894.
Action and Response History in U.S. Appl. No. 11/647,836.
Acunto, S. et al., "A new bidimensional histogram for the dynamic characterization of ADCs", Proc. of the 18th IEEE Instrumentation and Measurement Technology Conference (2001 IMTC), vol. 3, pp. 2015-2020 (2001).
Adamo, F. et al., "A/D converters, nonlinearity measurement and correction by frequency analysis and dither", IEEE Transactions on Instrumentation and Measurement, vol. 52, No. 4, pp. 1200-1205, (Aug. 2003).
Asta, D. and Irons, F.H., "Dynamic Error Compensation of Analog-to-Digital Converters", The Lincoln Laboratory Journal, vol. 2, No. 2, pp. 161-181 (1989).
Babu, B. and Wollman, H.B., "Testing an ADC linearized with pseudorandom dither", IEEE Transactions on Instrumentation and Measurement, vol. 47, No. 4, pp. 839-848 (Aug. 1998).
Brannon, B., "Overcoming Converter Nonlinearities with Dither", Analog Devices Application Note AN-410, 8pp. (Dec. 1995).
Goodman, J. et al. "Extending the dynamic range of Rf receivers using nonlinear equalization", 2009 International Waveform Diversity and Design Conference, pp. 224-228, ( © 2009).
Hsu, C. et al., "A distortion correction method for endoscope images based on calibration patterns and a simple mathematic model for optical lens", Biomedical Engineering Applications Basis Communications, vol. 17; pt. 6, pp. 309-318 (2005).
Larrabee, J. et al, "Using sine wave histograms to estimate analog-to-digital converter dynamic error functions", IEEE Transactions on Instrumentation and Measurement, vol. 47, No. 6, pp. 1448-1456 (Dec. 1998).
Tsimbinos, J. "Identification and Compensation of Nonlinear Distortion", PhD thesis—Univ. of South Australia, School of Electronic Engineering, 261 pp. (Feb. 1995).
Razavi, Behzad, "Principles of Data Conversion System Design", IEEE Press, 256pp. ( © 1995).

* cited by examiner

COMPENSATING FOR HARMONIC DISTORTION IN AN INSTRUMENT CHANNEL

CROSS-REFERENCE TO RELATED APPLICATIONS

This application is a continuation-in-part of U.S. application Ser. No. 12/724,894, filed on Mar. 16, 2010, now abandoned which is a continuation of U.S. application Ser. No. 11/647,836, filed on Dec. 29, 2006 now abandoned. The contents of U.S. application Ser. No. 11/647,836 and U.S. application Ser. No. 12/724,894 are hereby incorporated by reference into this application as if set forth herein in full.

TECHNICAL FIELD

This patent application relates generally to compensating for harmonic distortion in test and measurement instrumentation, such as automatic test equipment (ATE).

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. ATE is capable of providing signals to a DUT via its source channels. Capture channels receive signals from the DUT and forward those signals for processing to determine whether the DUT meets testing qualifications.

Harmonic distortion significantly limits the dynamic range of current generation ATE instrumentation. Audio, video, communications, and wireless systems are all sensitive to harmonic distortion, as is manifest in stringent total harmonic distortion (THD), spurious free dynamic range (SFDR), and adjacent channel power ratio (ACPR) specifications on devices for those markets. Across the frequency spectrum, from audio to very high frequency (VHF), instrument harmonic levels are typically more than 10 decibels (dB) higher than non-harmonic spurious signals. ATE users often determine that production tests of device AC (alternating current) linearity are limited by capabilities of their ATE instrumentation, particularly the harmonic distortion.

SUMMARY

This patent application describes methods and apparatus, including computer program products, for reducing harmonic distortion in an instrument channel of a device, including, but not limited to, ATE.

In general, this patent application describes an apparatus comprised of circuitry configured to pass a signal in a channel of the apparatus, and memory configured to store first and second correction values. A first correction value is based on a first version of the signal, where the first correction value is for use in correcting static non-linearity associated with the channel. A second correction value is based on a second version of the signal, where the second correction value is for use in correcting dynamic non-linearity associated with the channel. Digital signal processing logic is configured to use the first correction value, the second correction value, and the signal in order to compensate harmonic distortion from the channel. The apparatus may also comprise one or more of the following features.

The apparatus may include a phase shift circuit for shifting a phase of the signal to produce the second version of the signal. The phase shift circuit may comprise a Hilbert filter, and shifting may comprise shifting a phase of the signal by about 90°. The circuitry, the memory, and the logic may comprise parts of a capture channel of automatic test equipment (ATE). The capture channel may be for receiving signals from a device under test (DUT). The circuitry, the memory, and the logic may comprise parts of a source channel of the ATE. The source channel may be for providing signals to the DUT.

A first LUT (look-up table) may comprise plural first correction values, which are for use in correcting for a first N harmonics caused by the static non-linearity. The plural first correction values, $d_I(x)$, may comprise:

$$d_I(x) = \sum_{n=2}^{N} H_n \cdot \cos(\theta_n - n\phi) \cdot \cos(n \cdot \cos^{-1}(x)),$$

where $H_n$ is a magnitude of an $n^{th}$ harmonic, $\theta_n$ is a phase of the $n^{th}$ harmonic, x is a sample value of a signal in the channel, and $\phi$ is the phase of a fundamental signal that produces harmonics. The plural first correction values may be configured for correcting aliased harmonics. Furthermore, $$H_n = |H(f_{nalias})|,$$

$$\theta_n = \angle H(f_{nalias})$$

where $$f_{nalias} = nf_0 \bmod \frac{Fs}{2},$$

with $nf_0$ corresponding to an $n^{th}$ direct harmonic, and Fs corresponding to the sampling clock frequency of the channel. Alternatively, $$H_n = |H(f_{nalias})|$$

$$\theta_n = -\angle H(f_{nalias})$$

where $$f_{nalias} = \frac{Fs}{2} - nf_0 \bmod \frac{Fs}{2},$$

with $nf_0$ corresponding to an $n^{th}$ direct harmonic, and Fs corresponding to the sampling clock frequency of the channel.

A second LUT may comprise plural second correction values, which are for use in correcting for a first N harmonics caused by the dynamic non-linearity. The plural second correction values, $d_Q(x)$, may comprise:

$$d_Q(x) = -\sum_{n=2}^{N} H_n \cdot \sin(\theta_n - n\phi) \cdot \cos(n \cdot \cos^{-1}(x)), \text{ or}$$

$$d_Q(x) = -\sum_{n=2}^{N} H_n \cdot \sin(\theta_n - n\phi) \cdot \sin(n \cdot \sin^{-1}(x))$$

where $H_n$ is a magnitude of an $n^{th}$ harmonic, $\theta_n$ is a phase of the $n^{th}$ harmonic, x is a sample value of a signal in the channel, and $\phi$ is the phase of a fundamental signal that produces harmonics. The second first correction values may be configured for correcting aliased harmonics. Furthermore, $$H_n = |H(f_{nalias})|$$

$$\theta_n = \angle H(f_{nalias})$$

where $$f_{nalias} = nf_0 \bmod \frac{Fs}{2},$$

with $nf_0$ corresponding to an $n^{th}$ direct harmonic, and Fs corresponding to the sampling clock frequency of the channel. Alternatively, $$H_n = \mp |H(f_{nalias})|$$

$$\theta_n = -\angle H(f_{nalias})$$

where $$f_{nalias} = \frac{Fs}{2} - nf_0 \bmod \frac{Fs}{2},$$

with $nf_0$ corresponding to an $n^{th}$ direct harmonic, and Fs corresponding to the sampling clock frequency of the channel. The negative and positive signs of $H_n$ correspond to the upper and lower equations for $d_Q(x)$ respectively.

The apparatus may comprise a switchable filter bank in the channel. The switchable filter bank may comprise one or more filters that are switchable into, or out of, the channel. The one or more filters may be configured to compensate for harmonic distortion from the channel. The logic may comprise circuitry to combine the first correction value and the second correction value to produce a sum, and to subtract the sum from the signal, thereby reducing the harmonic distortion. The apparatus may be one of automatic test equipment (ATE), a data converter circuit, a signal generator, and a spectrum analyzer.

In general, this patent application also describes one or more machine-readable media comprising instructions that are executable to generate correction values that are usable to compensate for harmonic distortion in a channel of an instrument. The instructions are for causing one or more processing devices to generate first correction values for use in correcting static non-linearity associated with the channel of the instrument, to store the first correction values in memory, to generate second correction values for use in correcting dynamic non-linearity associated with the channel of the instrument, and to store the second correction values. The machine-readable medium/media may also comprise one or more of the foregoing, or the following, features.

The first correction values may be for use in correcting for a first N harmonics caused by the static non-linearity. The first correction values, $d_I(x)$, may comprise:

$$d_I(x) = \sum_{n=2}^{N} H_n \cdot \cos(\theta_n - n\phi) \cdot \cos(n \cdot \cos^{-1}(x)),$$

where $H_n$ is a magnitude of an $n^{th}$ harmonic, $\theta_n$ is a phase of the $n^{th}$ harmonic, x is a sample value of a signal in the channel, and $\phi$ is a phase of a fundamental signal that produces harmonics. When the phase, $\phi$, of the fundamental signal is zero, the first correction values, $d_I(x)$, may comprise:

$$d_I(x) = \sum_{n=2}^{N} H_n \cdot \cos(\theta_n) \cdot \cos(n \cdot \cos^{-1}(x)).$$

The first correction values may be configured for correcting aliased harmonics. If a direct harmonic occurs in an odd Nyquist zone of a sampling clock, then $$H_n = |H(f_{nalias})|$$

$$\theta_n = \angle H(f_{nalias})$$

where $$f_{nalias} = nf_0 \bmod \frac{Fs}{2},$$

with $nf_0$ corresponding to an $n^{th}$ direct harmonic, and Fs corresponding to a Nyquist frequency associated with the signal. If the direct harmonic occurs in an even Nyquist zone of the sampling clock, then $$H_n = |H(f_{nalias})|$$

$$\theta_n = -\angle H(f_{nalias})$$

where $$f_{nalias} = \frac{Fs}{2} - nf_0 \bmod \frac{Fs}{2}.$$

The second correction values may be for use in correcting for a first N harmonics caused by the dynamic non-linearity. The second correction values, $d_Q(x)$, may comprise:

$$d_Q(x) = -\sum_{n=2}^{N} H_n \cdot \sin(\theta_n - n\phi) \cdot \cos(n \cdot \cos^{-1}(x)),$$

or $$d_Q(x) = -\sum_{n=2}^{N} H_n \cdot \sin(\theta_n - n\phi) \cdot \sin(n \cdot \sin^{-1}(x))$$

where $H_n$ is a magnitude of an $n^{th}$ harmonic, $\theta_n$ is a phase of the $n^{th}$ harmonic, x is a sample value of a signal in the channel, and $\phi$ is a phase of a fundamental signal that produces harmonics. The second correction values may be configured for correcting aliased harmonics. If a direct harmonic occurs in an odd Nyquist zone of a sampling clock, then $$H_n = \mp |H(f_{nalias})|$$

$$\theta_n = -\angle H(f_{nalias})$$

where $$f_{nalias} = nf_0 \bmod \frac{Fs}{2},$$

with $nf_0$ corresponding to an $n^{th}$ direct harmonic, and Fs corresponding to the sampling clock frequency associated with the signal. If a direct harmonic occurs in an even Nyquist zone of the sampling clock, then $$H_n = \mp |H(f_{nalias})|$$

$$\theta_n = -\angle H(f_{nalias})$$

where $$f_{nalias} = \frac{Fs}{2} - nf_0 \bmod \frac{Fs}{2}.$$

The negative and positive signs of even Nyquist zone alias magnitude ($H_n$) correspond to the upper and lower equations for $d_Q(x)$ respectively.

The details of one or more examples are set forth in the accompanying drawings and the description below. Further features, aspects, and advantages will become apparent from the description, the drawings, and the claims.

DETAILED DESCRIPTION

Figure 1:
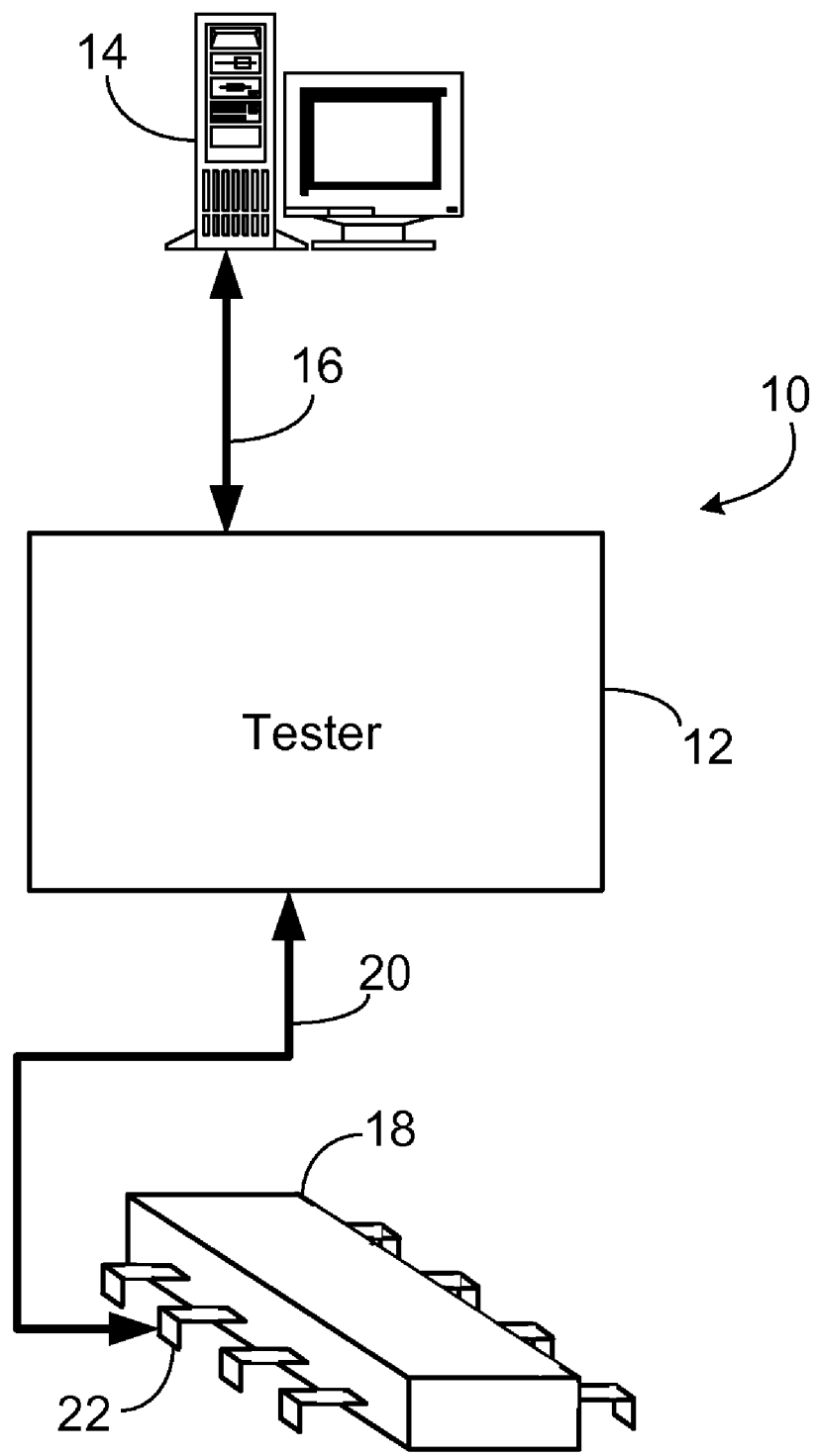
FIG. 1 is a block diagram of ATE for testing devices.

Referring to FIG. 1, a system 10 for testing a device-under-test (DUT) 18, such as a semiconductor device, includes a tester 12, such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
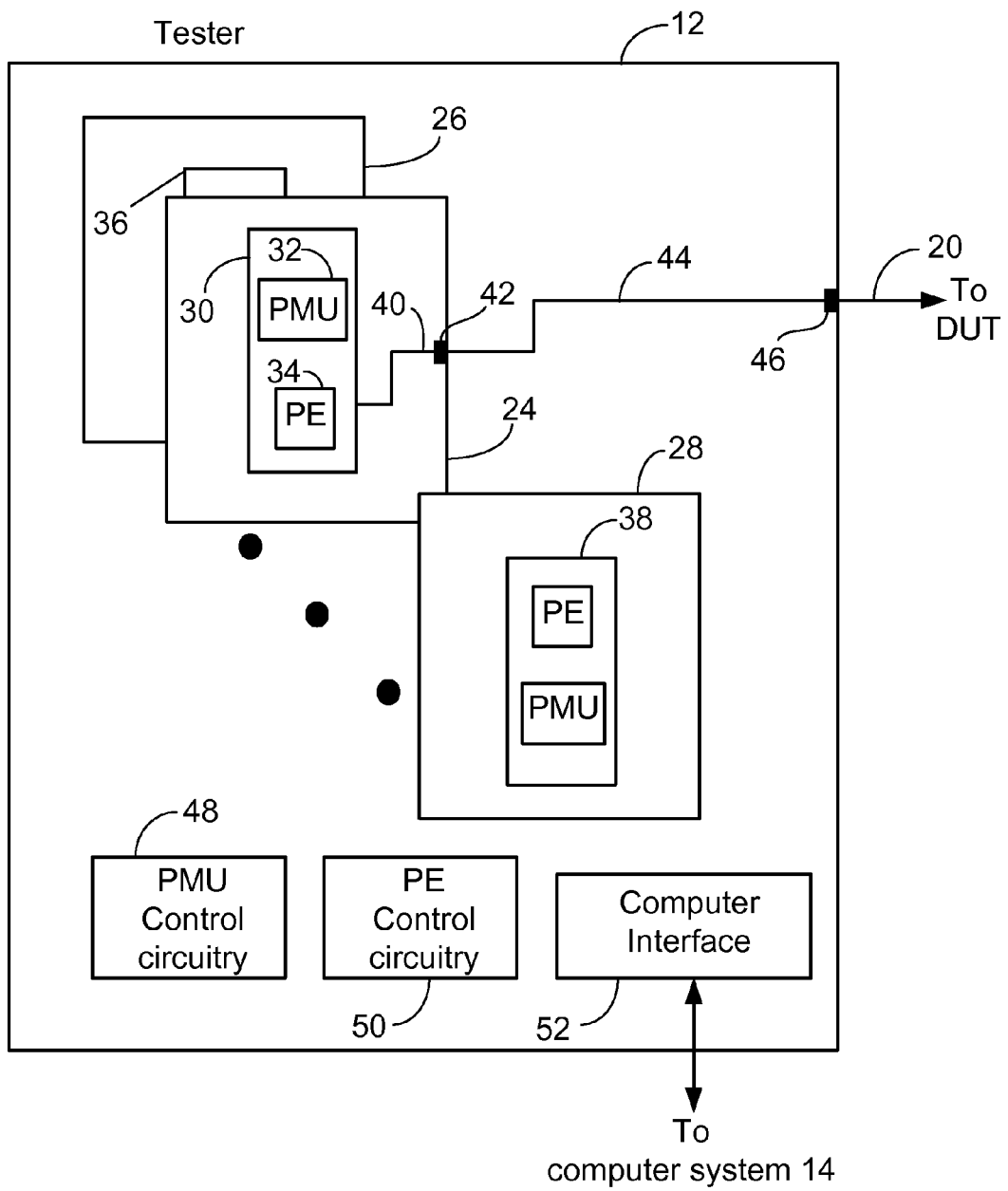
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also includes a computer interface 52 that allows computer system 14 to control the operations executed by tester 12 and also allows data (e.g., test parameters, DUT responses, etc.) to pass between tester 12 and computer system 14.

Figure 3A:
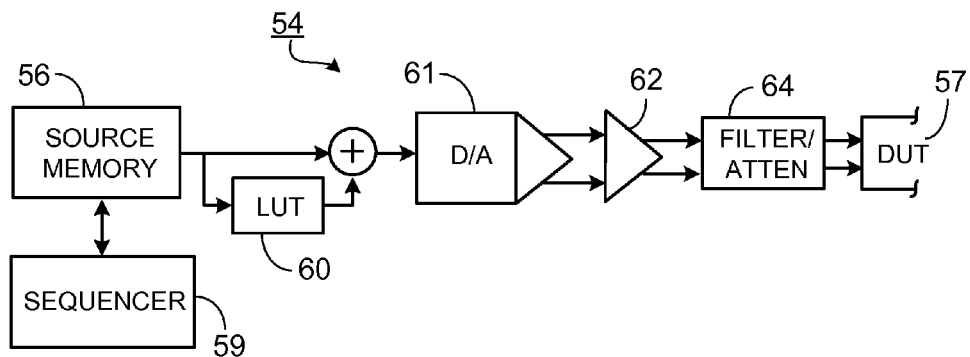
FIG. 3a is a block diagram of a source channel of the ATE.
Figure 3B:
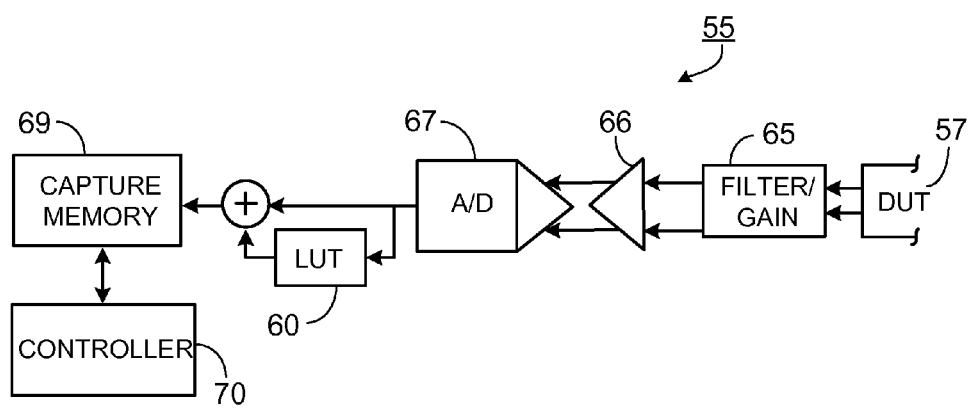
FIG. 3b is a block diagram of a capture channel of the ATE.

FIGS. 3a and 3b shows representative circuitry 54 and 55, e.g., digital signal processing logic. Circuitry 54 and 55 may be part of the PE stage of ATE. Circuitry 54 is part of a source channel, since it provides test data to a DUT. Circuitry 55 is part of a capture channel, since it receives (or "captures") data from the DUT, which has been generated in response to the test data.

Source channel circuitry 54 includes a source memory 56, which stores digital data that is used to generate test signals to output to DUT 57. A memory sequencer 59 outputs the digital data. Correction data from look-up tables (LUTs) 60 is then applied to the digital data. LUTs 60 include one or more LUTs stored in memory, and also include associated circuitry, as described below with respect to FIG. 4. The correction data is used to compensate for harmonic distortion in the digital data before that distortion is introduced (e.g., by the DAC described below). In this implementation, the correction data is added to the digital data; however, other implementations may use a different way to combine the correction data and the digital data. The corrected digital data is applied to digital-to-analog controller (DAC) 61, which generates analog signals that correspond to the corrected digital data. A driver 62 (e.g., an amplifier) outputs the resulting analog signals to an optional filter bank 64. In this implementation, the filter bank may be a switchable filter bank. The switchable filter bank may include one or more filters (e.g., capacitors) that are switchable into, or out of, the channel, and which may be configured to attenuate analog signals and to compensate for harmonic distortion from the channel. It is noted that switchable filter bank 64 need not be included in circuitry 54.

Capture channel circuitry 55 receives analog signals from DUT 57, and applies them to optional filter bank 65. Filter bank 65 may be a switchable filter bank of the type described above, and may apply a gain to analog signals. It is noted that switchable filter bank 65 need not be included in circuitry 55. A driver 65 provides the analog signals to analog-to-digital converter (ADC) 67. ADC 67 converts the analog signals to digital data. Correction data from LUTs 60 is then applied to the digital data. The correction data is used to compensate for harmonic distortion in the digital data after that distortion is introduced (e.g., by the ADC), as described below. A description of LUTs 60, and their contents, is provided below with respect to FIG. 4. In this implementation, the correction data is added to the digital data; however, other implementations may use a different way to combine the correction data and the digital data. The corrected digital data is applied to capture memory 69, from which it may be retrieved by a controller 70 analysis.

In both the source and capture channels, a direct digital synthesizer (DDS) (not shown in the figures) may provide input to a phase locked loop (PLL) to provide triggers for the ADC and DAC.

A description of the sources of possible sources of harmonic distortion is set forth below, followed by a description of processes for determining the correction data that is to be stored in LUTs 60 for use in correcting harmonic distortion.

Harmonic distortion, resulting from non-linearity, can be generated anywhere in an AC channel signal path. Examples of sources of harmonic distortion include, but are not limited to, the following: data converter (e.g., DAC or ADC) integral non-linearity (INL) errors; data converter differential non-linearity (DNL) errors; passive component non-linearity in the filters or analog signal path of the channel, e.g., voltage-dependent capacitance C(V), voltage-dependent resistance R(V), and current dependent inductance L(I); slew-rate limits of amplifiers in the channel; voltage-dependent capacitance in active circuits of the channel, such as substrate junction varactor effects in non-inverting amplifier topologies; timing errors in multi-pass data converter architectures, such as pipelined or subranging ADCs; and digital signal processor (DSP) sign extension errors, which may produce high order harmonics that may alias into a passband of the channel.

Sources of non-linearity in the channel can be separated into two independent modes: static and dynamic. Static non-linearity depends only on the current state (sample value) of the channel, and not on a previous time history of sample values. Consequently, static non-linearity is referred to as "memory-less". For example, resistor value errors in the reference of a data converter generate INL and DNL errors that depend only on the current sample. It is noted that individual resistors in this case can be linear relative to voltage or current and still generate non-linear errors, given the switched architecture of the data converter.

Dynamic non-linearity produces errors that depend on both a current sample value of the channel and the past history of sample values for the channel. One such error occurs in slew-rate limiting amplifiers. In slew-rate limiting amplifiers, an amplifier's output error is a function of the slope of the signal input to the amplifier, which can only be calculated with knowledge of the past history of the amplifier's input signal. Compensating for errors introduced by components with non-linear C(V) or L(I) characteristics also requires knowledge of past history, since error(s) introduced by such components may include a phase shift of the output signal.

Relatively accurate compensation of converter AC non-linearity in a signal can require precise measurement of the magnitude and phase of the harmonics. Some implementations use frequency selective analog filters together with a complementary converter to perform the measurement. For example, a source may be calibrated at a particular frequency using a notch filter centered at that frequency and an uncalibrated digitizer. The notch filter is employed to reduce the chance that the digitizer distortion corrupts measurement of the source harmonics.

Harmonic distortion produced by, e.g., the non-linearities described above, is periodic relative to a fundamental calibration test signal (e.g. a signal used to generate error correction values for storage in LUTs 60), and produces a finite number (N) of harmonics above a noise floor of the system. Thus, this harmonic distortion d(t) can be modeled using a general Fourier Series expansion as follows:

$$d(t) = \sum_{n=2}^{N} H_n \cdot \cos(n \cdot \omega \cdot t + \theta_n), \quad (1)$$

where t refers to time, and where $H_n$ and $\theta_n$ are the magnitude and phase of an $n^{th}$ harmonic as measured by Fast Fourier Transform (FFT) processing of a sampled and quantized test signal used for calibration.

Any signal, such as d(t) in equation (1), can be separated into an orthogonal superposition of an even function and an odd function, as follows:

$$x(t) = x_E(t) + x_O(t),$$

where $x_E(t) = \frac{1}{2} \cdot [x(t) + x(-t)]$ and $x_O(t) = \frac{1}{2} \cdot [x(t) - x(-t)]$.

The Fourier transform of this resulting test signal, x(t), can be written using the following superposition $$X_t(\omega) = X_R(\omega) + j \cdot X_I(\omega)$$

where $X_R(\omega)$ and $X_I(\omega)$ are the real and imaginary parts of $X(\omega)$. A useful property of real-valued signals, exploited in the linearity correction process described herein, is Hermitian symmetry, i.e., that $X_R(\omega)$ and $X_I(\omega)$ are equivalent to the Fourier Transform of the even parts and the odd parts, respectively, of x(t).

Expanding equation (1) above into even and odd terms using trigonometric identities yields the following general expression for harmonic distortion:

$$d(t) = \sum_{n=2}^{N} H_n \cdot [\cos(\theta_n) \cdot \cos(n \cdot \omega \cdot t) - \sin(\theta_n) \cdot \sin(n \cdot \omega \cdot t)] \quad (2)$$

Since static non-linearity produces errors that depend only on the current amplitude (e.g., sample value) of the fundamental calibration signal, it follows that the error function produced by this non-linearity must have the same symmetry as the fundamental calibration signal. Choosing an even function for the fundamental calibration signal, such as a zero phase cosine, ensures that static nonlinearity produces distortion that is reflected completely in the real part of the FFT. In this case, with purely static non-linearity and no dynamic component, the distorted signal is an even function, the FFT is completely real-valued, and equation (2) reduces to $$d(t) = \sum_{n=2}^{N} H_n \cdot \cos(\theta_n) \cdot \cos(n \cdot \omega \cdot t) \quad (3)$$

where $\theta_n = 0, \pi$ for all n.

If the fundamental calibration signal is even, any energy in the imaginary part of the FFT will be the result of an odd component in the harmonic distortion. Because this odd component to the harmonic has orthogonal symmetry to the fundamental calibration signal, the odd component must have originated from non-linearity with memory (i.e., dynamic non-linearity). Thus, dynamic non-linearity produces a component of the error signal (harmonic distortion) with orthogonal symmetry to the fundamental calibration signal, i.e., odd if the fundamental calibration signal is a cosine signal.

Static and dynamic non-linearity can be separated and measured independently using a combination of signal processing theory and ATE mixed-signal synchronization. If a calibrator uses a pattern to trigger an ATE capture instrument at a peak of a sinusoid produced by an arbitrary waveform generator (AWG) source, then the calibrator can exploit the symmetry properties of the Fourier Transform to determine a distortion compensation function. In this case, the captured calibration test signal, y(t), has the form of a zero phase cosine with additive harmonic distortion d(t), such that:

$$y(t) = \cos(\omega \cdot t) + d(t).$$

The error signal (d(t)) produced by a combination of static and dynamic non-linearity can be generated digitally using an orthogonal basis of sine and cosine functions. One implementation that uses a Hilbert Filter to generate the quadrature component of this basis in conjunction with look-up table (LUT) memories is shown in FIG. 4.

More specifically, because the harmonic distortion signal is periodic and real valued, the harmonic distortion signal can be represented by a general Fourier Series with an orthogonal basis of sine and cosine functions using equation (2). Thus, it is possible to digitally reconstruct the harmonic distortion signal using two look-up tables: an "I-LUT" addressed with the fundamental signal and a parallel "Q-LUT" addressed by quadrature signal followed by a 90° phase shift Hilbert filter. The reconstructed harmonic distortion signal may then be used to compensate the channel non-linearity by predistorting the input to a digital-to-analog converter (DAC) (for a source channel) or with post-conversion correction of an ADC output (for a capture channel).

Figure 4:
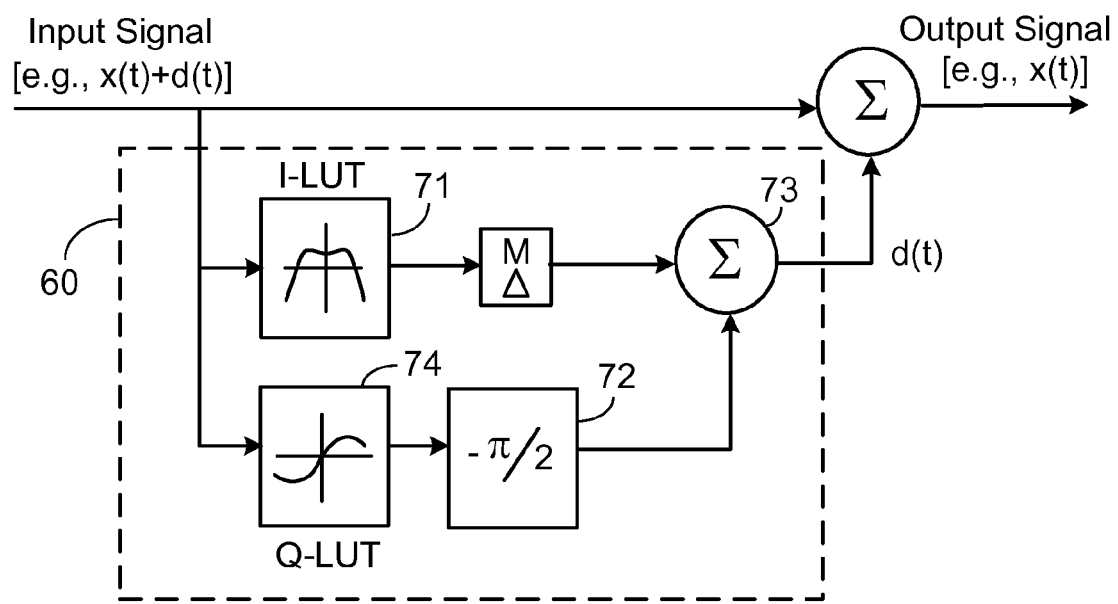
FIG. 4 is a block diagram of look-up tables (LUTs) and associated circuitry used to compensate for harmonic distortion in the source and capture channels of FIGS. 3a and 3b, respectively.

Referring to FIG. 4, static non-linearity is compensated using an "in-phase" look-up table (I-LUT) 71 to implement a memory-less correction function that depends solely on a current value of x(t) (the signal being corrected). In an example, dynamic non-linearity is compensated with a memoryless "quadrature" look-up table (Q-LUT) followed by a 90 degree phase shift 72, which may be constant over a broad frequency range. The group delay of this digital filter may balance with a pipeline of M shift register stages inserted in the I-LUT signal path. Regarding FIG. 4, the labels of x(t)+d(t) at the input and x(t) at the output imply a signal flow for the capture case. In the source case, the block diagram is the same only the labels change to x(t) at the input and x(t)+d(t) at the output, given that we pre-distort the source prior to the D/A.

As shown in FIG. 4, the error correction data outputs of I-LUT 71 and Q-LUT 74 are combined using an adder 73 to produce the error, d(t), which is then subtracted from the input signal. The configuration of FIG. 4 can be used for LUTs 60 in the capture channel shown in FIG. 3b, and for LUTs 60 in the source channel shown in FIG. 3a Each individual LUT (I-LUT 71 and Q-LUT 74) implements a polynomial function, $f_{LUT}$, of its address, which is defined as follows:

$$f_{LUT}(x) = \sum_{n=2}^{N} a_n \cdot x^n$$

This polynomial describes a memory-less non-linearity. The $n^{th}$ term of this non-linearity produces an $n^{th}$ harmonic in response to a sinusoidal input, x(t).

Using a zero phase cosine signal for the fundamental calibration signal, correction data for storage in the I-LUT can be determined from the real part of the calibration signal FFT, and similarly correction data for storage in the Q-LUT can be determined from the imaginary part of the calibration signal FFT. Determining the I-LUT correction data includes mapping the harmonic distortion from a function of time to a function of amplitude, given that the I-LUT is addressed by a current sample value (amplitude).

LUT Correction Values: First Implementation

Exploiting the choice of a zero phase cosine for the calibration signal, the I-LUT can be determined directly from the real part of the test signal FFT, and similarly the Q-LUT can be determined directly from the imaginary part of the test signal FFT. Determining the lookup table correction data includes mapping the distortion from a function of time to a function of amplitude, given that the tables are addressed by the current sample value.

Each harmonic real component $(\cos(\theta_n)\cos(n\cdot\omega\cdot t))$ may be represented as a weighted polynomial in powers of $\cos(\omega\cdot t)$. The input to the I-LUT is the primary data stream given by $x(t)=\cos(\omega\cdot t)$. For particular amplitude of x, the time at which it occurred within the first half cycle is given by $$t = \omega^{-1} \cdot \cos^{-1}(x).$$

where the full scale range $x \in [-1,1]$ is mapped to $$t \in \left[0, \frac{\pi}{\omega}\right].$$

Errors associated with each code value in the second half cycle may be identical to the corresponding code values in the first half cycle given the memory-less property of the static distortion. Substituting for the variable t in equation 3 above gives the following equation for loading the I-LUT based on the FFT harmonic amplitude and phase data:

$$d_I(x) = \sum_{n=2}^{N} H_n \cdot \cos(\theta_n) \cdot \cos(n \cdot \cos^{-1}(x)) \tag{4}$$

The last term in equation (4) may be recognized as a Chebyshev trigonometric polynomial $T_n(x)$ where $$T_n(x) = \cos(n \cdot \cos^{-1}(x))$$

generates $\cos(n \cdot \omega \cdot t)$ with an nth order polynomial in $x = \cos(\omega_0 \cdot t)$.

In order to utilize the Chebyshev generating function to determine the Q-LUT table values the imaginary component of the $n^{th}$ harmonic may be represented as a weighted polynomial in powers of $\cos(\omega\cdot t)$ given that the table is addressed by the current sample value. This mapping can be accomplished using the Hilbert transform $H\{\cdot\}$ described below. The quadrature component of the distortion described in equation 2 can be generated with a trigonometric polynomial as follows $$d_q(t) = -\sum_{n=2}^{N} H_n \cdot \sin(\theta_n) \cdot \sin(n \cdot \omega \cdot t)$$

$$= -\sum_{n=2}^{N} H_n \cdot \sin(\theta_n) \cdot \cos\left(n \cdot \omega \cdot t - \frac{\pi}{2}\right)$$

$$= -\sum_{n=2}^{N} H_n \cdot \sin(\theta_n) \cdot H\{\cos(n \cdot \omega \cdot t)\}$$

$$= H\left\{-\sum_{n=2}^{N} H_n \cdot \sin(\theta_n) \cdot \cos(n \cdot \omega \cdot t)\right\}$$

$$= H\left\{-\sum_{n=2}^{N} H_n \cdot \sin(\theta_n) \cdot \cos(n \cdot \cos^{-1}(x))\right\}$$

The Q-LUT shown in FIG. 4 is addressed by x and produces an output $d_q(x)$ that, when passed through the Hilbert digital filter, produces $d_q(t)$. Thus the Q-LUT data is determined from the operand of the Hilbert transform in the above equation:

$$d_q(x) = -\sum_{n=2}^{N} H_n \cdot \sin(\theta_n) \cdot \cos(n \cdot \cos^{-1}(x)). \tag{5}$$

Equations 4 and 5 provide closed-form solutions for computing correction tables for the first N harmonics produced by non-linearity in an instrument channel. The process for computing table entries for an M-bit address LUT quantizes $x \in [-1,1]$ in $2^M$ values and calculates the corresponding error corrections using the equations for $d_I(x)$ and $d_q(x)$. These expressions are only valid if the harmonic amplitudes and phases result from FFT processing on a capture of a zero phase cosine fundamental calibration signal.

The foregoing process assumes an FFT measurement on a capture of a zero-phase cosine in order to develop the concept and demonstrate the underlying symmetry that the digital correction exploits. Although patterned-controlled ATE can very closely approximate this situation, in practice it can be time-consuming to achieve, and the residual phase error resulting from variability in delay through the instrument analog signal path may limit performance. Allowing an arbitrary trigger point for the capture implies that the "calibration" signal used to measure the harmonic amplitudes and phases has the form $$x(t) = \cos(\omega_0 \cdot t + \phi) \tag{6}$$

where $\phi$ is the arbitrary non-zero phase of the captured fundamental tone. This more general approach is consistent with ATE capabilities and end-applications, where exact frequency ratios are achieved for coherency and typical FFT measurements are indifferent to the fundamental tone phase. If $\phi$ is non-zero the fundamental signal contains both an even and odd component and consequently both static and dynamic non-linearity produce mixed-symmetry outputs. Thus the I-LUT and Q-LUT compensation tables can no longer be determined from the real and imaginary components of the harmonics directly.

In order to use $H_n$ and $\theta_n$ to correctly load compensation functions in the look-up tables, an orthogonal basis is created around the harmonic phase residual resulting from the dynamic linearity, i.e. $\theta_n$ with the contribution from $\phi$ removed. Recognizing that the $n^{th}$ term of the polynomial describing the memory-less non-linear system produces an $n^{th}$ harmonic in response to $x(t)$, and rotates the phase of $x(t)$, by $n \cdot \phi$, the distortion can be described by $$d(t) = \sum_{n=2}^{N} H_n \cdot \cos(n \cdot \omega_0 \cdot t + n \cdot \phi + \theta_n - n \cdot \phi)$$

Expanding the above equivalent form of the Fourier series representation of d(t) onto an orthogonal basis of sine and cosine functions results in:

$$d(t) = \sum_{n=2}^{N} H_n \cdot [\cos(\theta_n - n \cdot \phi) \cdot$$

$$\cos(n \cdot \omega_0 \cdot t + n \cdot \phi) - \sin(\theta_n - n \cdot \phi) \cdot \sin(n \cdot \omega_0 \cdot t + n \cdot \phi)]$$

If the channel non-linearity is purely static, then $\theta_n - n\phi = 0, \pi$ and the sine component above is null. Thus each cosine term of the above expression is "in-phase" with the fundamental, i.e. each harmonic term angle is rotated by n, the expected response due the $n^{th}$ order component to static non-linearity in the channel. In contrast the sine term involves both rotation by n and a quadrature phase shift from the fundamental.

Thus the I-LUT error correction is determined from the in-phase distortion by mapping from the time to amplitude domains at its input $$t=\omega_0^{-1} \cdot (\cos^{-1} x - \phi).$$

Substituting for t in the "in-phase" term for d(t) provides the following closed-form solution for computing the I-LUT correction data.

$$d_I(x) = \sum_{n=2}^{N} H_n \cdot \cos(\theta_n - n\phi) \cdot \cos(n \cdot \cos^{-1}(x)) \quad (7)$$

Following the methodology described herein, and substituting $\psi=\omega_0 t+\phi$, the quadrature correction in terms of a non-zero phase fundamental signal is $$d_q(t) = -\sum_{n=2}^{N} H_n \cdot \sin(\theta_n - n\phi) \cdot \sin(n\psi)$$

$$= -\sum_{n=2}^{N} H_n \cdot \sin(\theta_n - n\phi) \cdot \cos\left(n\psi - \frac{\pi}{2}\right)$$

$$= -\sum_{n=2}^{N} H_n \cdot \sin(\theta_n - n\phi) \cdot H\{\cos(n \cdot \psi)\}$$

$$= -\sum_{n=2}^{N} H_n \cdot \sin(\theta_n - n\phi) \cdot H\{T_n(x)\}$$

$$= H\left\{-\sum_{n=2}^{N} H_n \cdot \sin(\theta_n - n\phi) \cdot \cos(n \cdot \cos^{-1}(x))\right\}.$$

The Q-LUT shown in FIG. 4 is addressed by x and produces an output $d_q(x)$ that when passed through the Hilbert digital filter produces $d_q(t)$. Thus the Q-LUT data is computed from the operand of the Hilbert transform in the above equation, as follows:

$$d_Q(x) = -\sum_{n=2}^{N} H_n \cdot \sin(\theta_n - n\phi) \cdot \cos(n \cdot \cos^{-1}(x)). \quad (8)$$

As previously described, the algorithm for computing table entries for an M-bit address LUT quantizes $x \in [-1,1]$ in $2^M$ values and calculates the corresponding error corrections using equations (7) and (8). This process provides a comprehensive correction using harmonic information contained in a coherent FFT of a capture with arbitrary phase at the trigger point. It is noted that equations (7) and (8) reduce to equations (4) and (5), respectively, when the phase offset, $\phi$, is zero. The range of validity of this closed-form implementation solution includes compensation of both even and odd mode distortion produced by static or dynamic non-linearity up to order N.
LUT Correction Values: Second Implementation As was the case in the first implementation above, the input to the I-LUT is the primary data stream given by $x(t)=\cos(\omega_0 \cdot t)$. For a particular amplitude of x, the time at which the sample occurred (within a first cycle) is given by the following:

$$t=\omega_0^{-1} \cdot \cos^{-1}(x).$$

Substituting $\omega_0^{-1} \cdot \cos^{-1}(x)$, for the variable t in equation (3) above results in the following equation, which is used to determine the I-LUT correction data:

$$d_I(x) = \sum_{n=2}^{N} H_n \cdot \cos(\theta_n) \cdot \cos(n \cdot \cos^{-1}(x))$$

The Q-LUT is addressed by a quadrature (approximately 90°) phase shifted version of x(t), namely:

$$x_q(t) = \cos\left(\omega_0 \cdot t - \frac{\pi}{2}\right) = \sin(\omega_0 \cdot t).$$

A signal flow topology with the Hilbert filter preceding the Q-LUT realizes this implementation.

The time associated with a particular sample value at the input of the Q-LUT is defined by the following equation:

$$t=\omega_0^{-1} \cdot \sin^{-1}(x).$$

Substituting $\omega_0^{-1} \sin^{-1}(x)$ for t in equation (2) results in the following equation for determining the Q-LUT correction data:

$$d_q(x) = -\sum_{n=2}^{N} H_n \cdot \sin(\theta_n) \cdot \sin(n \cdot \sin^{-1}(x)).$$

A process for determining table entries for an M-bit address LUT quantizes $x \in [-1,1]$ in $2^M$ values and determines corresponding error correction data using the preceding equations for $d_I(x)$ and $d_q(x)$. It is noted that these equations are only valid if the harmonic amplitudes and phases result from FFT processing on a zero phase cosine fundamental calibration signal. Although patterned-controlled ATE signals can approximate a zero phase cosine fundamental calibration signal, in practice this can be time-consuming to achieve, and a residual phase error resulting from variability in delay through the instrument's analog signal path can limit signal correction. Allowing a non-zero phase for the fundamental calibration signal means that the calibration signal used to measure the harmonic amplitudes and phases has the form $$x(t)=\cos(\omega_0 \cdot t+\phi)$$

where $\phi$ is the arbitrary non-zero phase of the fundamental calibration signal. This more general approach is consistent with ATE capabilities and end-applications, where exact frequency ratios are achieved for coherency and typical FFT measurements are indifferent to the fundamental signal phase.

If $\phi$ is non-zero, the fundamental calibration signal contains both an even and odd component and, consequently, both static and dynamic non-linearity produce mixed-symmetry outputs. In order to use $H_n$ and $\theta_n$ to correctly load correction data in the look-up tables, it is necessary to create an orthogonal basis around the harmonic phase residual resulting from the dynamic linearity, i.e. $\theta_n$, with the contribution from $\phi$ removed. Recognizing that the $n^{th}$ term of the polynomial describing the memory-less, non-linear system produces an $n^{th}$ harmonic in response to x(t), and rotates the phase of x(t) by n·φ, the harmonic distortion in an instrument channel can be modeled as $$d(t) = \sum_{n=2}^{N} H_n \cdot \cos(n \cdot \omega_0 \cdot t + n \cdot \phi + \theta_n - n \cdot \phi).$$

Expanding the above equation onto an orthogonal basis of sine and cosine functions results in the following:

$$d(t) = \sum_{n=2}^{N} H_n \cdot [\cos(\theta_n - n \cdot \phi) \cdot \cos(n \cdot \omega_0 \cdot t + n \cdot \phi) - \sin(\theta_n - n \cdot \phi) \cdot \sin(n \cdot \omega_0 \cdot t + n \cdot \phi)].$$

If the channel non-linearity is purely static, then $\theta_n - n\phi = 0, \pi$ and the sine component above is zero. Thus, each cosine term of the above expression is "in-phase" with the fundamental signal, i.e., each harmonic term angle is rotated by n, which is the expected response due the $n^{th}$ order component to static non-linearity in the channel. In contrast, the sine term involves both rotation by n and a quadrature phase shift from the fundamental signal.

Thus, the I-LUT error correction data is determined from the in-phase distortion by mapping from the time domain to the amplitude domain at an input to the I-LUT, as follows:

$t = \omega_0^{-1} \cdot (\cos^{-1} x - \phi)$.

Substituting $\omega_0^{-1} \cdot (\cos^{-1} x - \phi)$ for t in the "in-phase" term for d(t) provides the following closed-form equation for determining the I-LUT error correction data.

$$d_I(x) = \sum_{n=2}^{N} H_n \cdot \cos(\theta_n - n\phi) \cdot \cos(n \cdot \cos^{-1}(x)) \quad (9)$$

The relationship between a sample value and the time at which the sample occurred (in a first cycle) at the input to the Q-LUT is given by $t = \omega_0^{-1} \cdot (\sin^{-1} x - \phi)$ Substituting $\omega_0^{-1} \cdot (\sin^{-1} x - \phi)$ for t in the "quadrature" term for d(t) above results the following closed-form solution for determining the Q-LUT error correction data.

$$d_Q(x) = -\sum_{n=2}^{N} H_n \cdot \sin(\theta_n - n\phi) \cdot \sin(n \cdot \sin^{-1}(x)) \quad (10)$$

As described above, the process for determining table entries for an M-bit address LUT quantizes $x \in [-1, 1]$ in $2^M$ values and determines the corresponding error correction data using the foregoing equations for $d_I(x)$ and $d_Q(x)$. This second implementation is capable of correcting both even and odd mode static distortion, as well as odd mode dynamic distortion. However attempting to correct even mode dynamic distortion using the second implementation method for computing $d_Q(x)$ may introduce odd mode artifacts. These artifacts result because the $\sin(n \cdot \sin^{-1}(x))$ terms, unlike the Chebyshev polynomials of the first implementation, are not a complete generating function for the harmonics.

The following describes how I-LUT and Q-LUT error correction values are determined for all samples of a data converter used in exemplary ATE. More specifically, prior to use, the error correction values for the I-LUT and the Q-LUT are determined for a range of signals that pass through the source and capture channels of the ATE. These error correction values are then stored in the I-LUT and Q-LUT, and are used to correct subsequent signals passing through the source and capture channels. The following is used to determine the range of signals (codes of a data converter) over which to determine the error correction values that are to be stored in the I-LUT and Q-LUT.

If a continuous sine wave is randomly sampled with uniform probability over the range $[0, 2\pi]$, the probability that the sinusoid obtains the value x is given by $$p(x) = \frac{1}{\pi \cdot \sqrt{A^2 - x^2}},$$

where A is the amplitude of the sine wave. This distribution has the familiar "bathtub" curve shape with a minimum at mid-scale x=0 of $(\pi \cdot A)^{-1}$.

In one example, the probability that a code i is produced by a data converter that uniformly samples a sine wave on the interval $[0, 2\pi]$ and quantizes to N bits is given by integrating the above expression over the amplitude range for code i, with the following result:

$$P(i) = \frac{1}{\pi} \cdot \left[ \sin^{-1}\left( \frac{FSR \cdot (i - 2^{N-1})}{A \cdot 2^N} \right) - \sin^{-1}\left( \frac{FSR \cdot (i - 1 - 2^{N-1})}{A \cdot 2^N} \right) \right],$$

where FSR is the bipolar full-scale range of the quantizer and A is the sine wave amplitude. If the sine wave amplitude is matched to the full-scale range of the quantizer, with zero DC (Direct Current) offset, the least probable output code i occurs at mid-scale $i = 2^{N-1}$ with a probability of $1/(\pi \cdot 2^{N-1})$. Thus, the probability of occurrence of a mid-scale code decreases with the number of quantizer levels.

In order to provide a robust calibration, it is desirable to have the measurement process exercise every code of the converter. The expected number of code hits E(i) in a capture containing a number "Nsamples" of samples is given by $E(i) = P(i) \cdot N\text{samples}$.

Ensuring that the least probable mid-scale code is hit at least once implies that $N\text{samples} \geq \pi \cdot 2^{N-1}$.

Thus, all codes calibration of a 16-bit converter using a fast radix-2 FFT process requires capture of at least 131,072 samples. While this constraint may be necessary to ensure that all converter codes are hit, it may not be sufficient, given that the sampling process can generate the same subset of codes on every cycle of the test waveform. In order to ensure that this degenerate case does not occur, the integer number of cycles of the test waveform in the capture window (M) should be mutually prime with respect to Nsamples (the FFT record length L). This constraint ensures that the system quantization noise does not correlate with the fundamental test signal and generate distortion artifacts. In order to ensure that aliased harmonics of order less than N map to distinct FFT bins, it is recommended that the ratio L/M also be a non-terminating decimal number.

The error correction data in the I-LUT and Q-LUT may be configured to correct for reflected, or aliased, harmonics in the instrument channel. Compensating for aliased frequency components includes correcting an aliased harmonic resulting from mixing of an $n^{th}$ component of a non-linearity with the clock used for sampling analog data. Compensating these aliased frequency components has the potential to improve the ATE's dynamic range when sourcing or capturing high frequency signals.

For a complete Nth order correction, measurement of the system non-linearity is performed using a fundamental test signal of frequency that is chosen to ensure that the first N harmonics map to N distinct bins of the FFT, even under conditions of aliasing. Coherent sampling is enhanced if the ratio is a rational number, L/M, where L and M are integers representing the FFT record length and fundamental bin number respectively. If L and M are chosen according to the criteria described above, there is sufficient information preserved in the test signal spectrum to determine an effective compensation of the system non-linearity in presence of aliasing.

For an $N^{th}$ order correction, it may be necessary to predict where, in the capture spectrum, each of the N harmonics will appear. Thus, for each harmonic $nf_o$ (where $f_o$ is the fundamental frequency), the following process is used to determine the frequency (FFT bin number) where an $N^{th}$ harmonic occurs, and the associated amplitude and phase to use in the LUT error correction data computations.

If the harmonic occurs in an odd Nyquist zone of the sampling clock defined as $$nf_0 \in \left[(m-1) \cdot \frac{F_s}{2}, m \cdot \frac{F_s}{2}\right],$$

where m is odd and Fs is the sample clock frequency, then the aliased harmonic is a direct image of the original harmonic. In this case, the frequency of the aliased harmonic is given by $$f_{nalias} = nf_0 \bmod \frac{F_s}{2}$$

where x mod y is the remainder of x/y. The magnitude and phase of this measured complex aliased frequency component, designated $H(f_{nalias})$, is used in equations (7) and (8) (or (4) and (5)) to determine the correction data. That is, for equations (7) and (8) (or (4) and (5)):

$H_n = |H(f_{nalias})|$ $\theta_n = \angle H(f_{nalias})$.

If the harmonic occurs in an even Nyquist zone of the sampling clock, then the aliased harmonic is a mirror image of the original harmonic and the frequency of the aliased harmonic is defined as follows:

$$f_{nalias} = \frac{F_s}{2} - nf_0 \bmod \frac{F_s}{2}.$$

Given that the image of the even Nyquist zone is mirrored, the phase is conjugate and the harmonic amplitude and phase components of equations (7) (or (4) or (9)) are defined by $H_n = |H(f_{nalias})|$ $\theta_n = -\angle H(f_{nalias})$.

The negative phase of the aliased frequency component is used because the harmonic mixing with the clock produces a conjugate phase and not the channel non-linearity. Consequently, the conjugate of the alias spur phase is used to address the mixing effect.

Furthermore the LUT correction outputs also reflect around the system sample clock frequency. Consequently the sign of the quadrature term of the $n^{th}$ order correction changes if the direct synthesized harmonic aliases from an even Nyquist zone. Thus the harmonic amplitude and phase components of equations (8) (or (5)) are defined by $H_n = -|H(f_{nalias})|$ $\theta_n = -\angle H(f_{nalias})$.

The general equations for determining the non-linearity correction data including aliasing using the equations in the first implementation above are as follows:

$$d_I(x) = \sum_{n=2}^{N} H_n \cdot \cos(\theta_n - n\phi) \cdot T_n(x)$$

$$d_Q(x) = \sum_{n=2}^{N} (-1)^{m_n} H_n \cdot \sin(\theta_n - n\phi) \cdot T_n(x)$$

where the magnitude and phase components are given by $H_n = |H(f_{nalias})|$ $\theta_n = (-1)^{m_n+1} \angle H(f_{nalias})$, and $m_n$ is the Nyquist zone of the $n^{th}$ harmonic $nf_0$ defined above. These equations are also valid for direct harmonics; in this case $f_{nalias} = nf_0$ and $m_n = 1$.

Test results are described below for reducing harmonics in the ATE channels using error correction data in the I-LUT and Q-LUT described above.

Figure 5A:
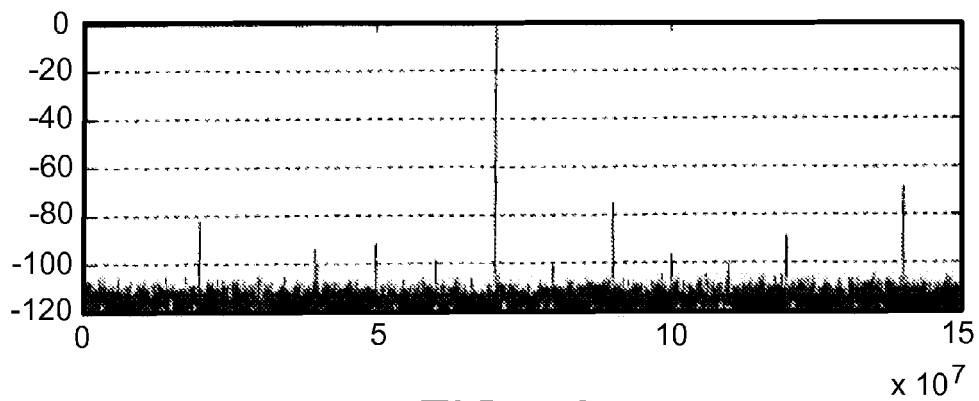
FIG. 5a is a graph showing a signal with harmonic distortion.
Figure 5B:
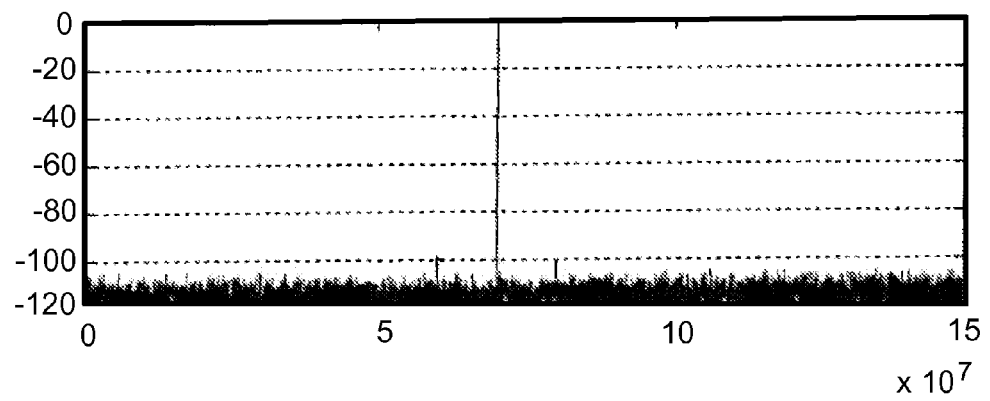
FIG. 5b is a graph showing a reduction in the harmonic distortion following correction using the LUTs of FIG. 4.

FIG. 5a shows an example of a sinusoidal test signal with additive white noise $x(t) = \cos(2\pi \cdot 70e6 \cdot t + \pi/4) + 0.001 \cdot rand(t),$ which is passed through a non-linear system with transfer function $y(t) = x(t) + 0.001 \cdot |x(t)| + 0.001 \cdot x(t) \cdot |x(t)|.$ In this example, the sample rate is 300 Msps (million samples-per-second). The non-linearity generates both even and odd high-order harmonics given the absolute value discontinuity and its inherent symmetry. The correction process described above, which uses the I-LUT and Q-LUT error correction data, reduces both direct and reflected harmonics as shown in FIG. 5b. That is, FIG. 5b shows the FFT of a resulting compensated output, with its dynamic range improved by 30 dB.

Figure 6:
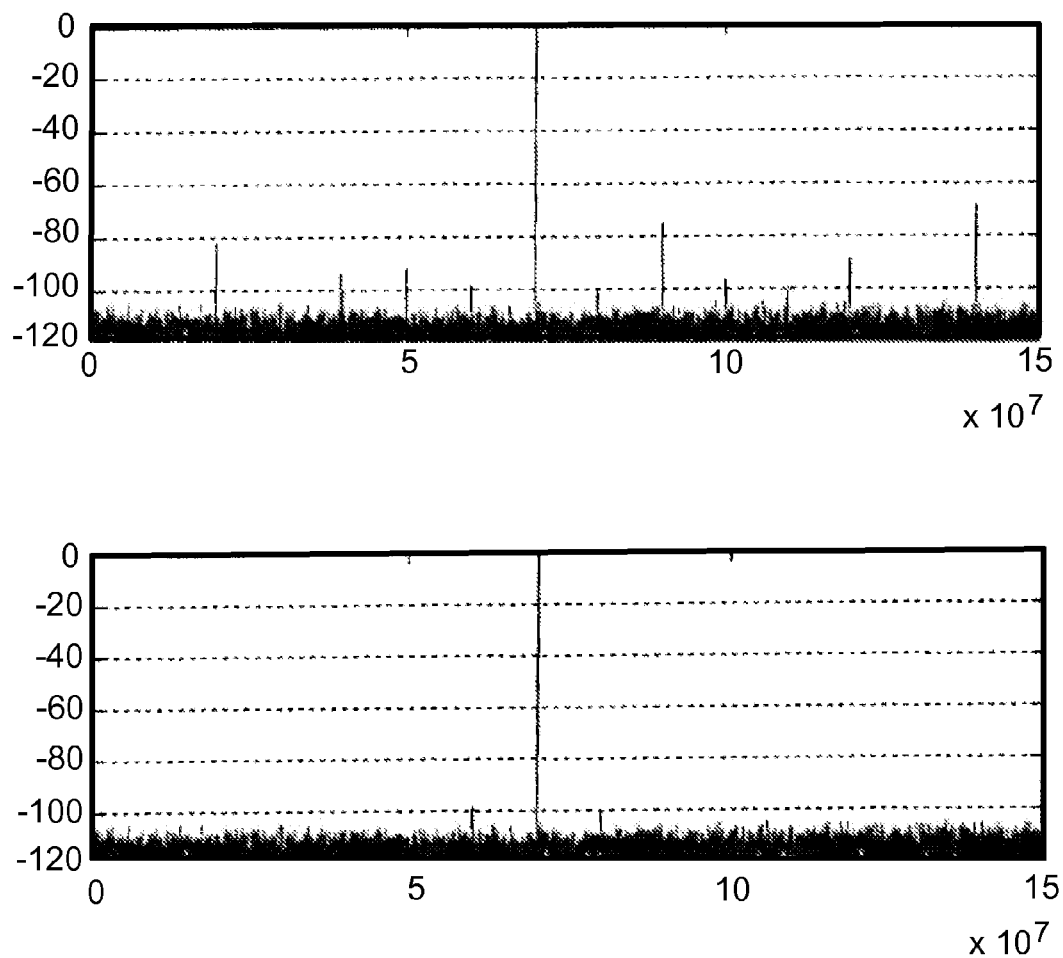
FIG. 6 shows signals compensated for harmonic distortion.
Figure 7:
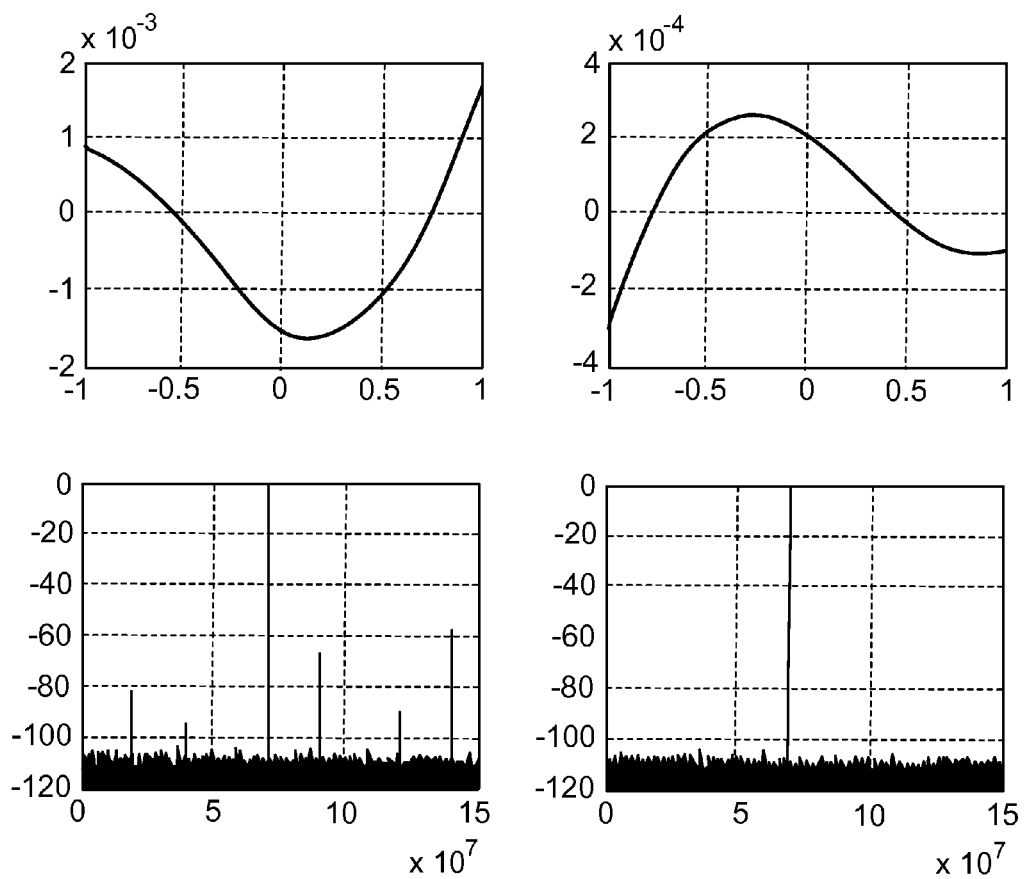
FIG. 7 shows examples of sinusoidal test signal distorted by both a static non-linearity and a dynamic non-linearity, as well as the LUT correction data plotted vs. full scale input range [−1,1].

The top graph in FIG. 6 shows an FFT of 70 MHz tone distorted by 0.001*(abs(x)+x*abs(x)) non-linearity, and the bottom graph of FIG. 6 shows an FFT of compensated output with dynamic range improved by 30 dB. In FIG. 7, the upper left shows I-LUT contents vs. full-scale range [−1,1], the upper right shows Q-LUT memory contents vs. full scale range from [−1,1], the lower left shows pre-correction signal spectrum, and the lower left shows post-correction signal spectrum FIG. 7 shows an example using the sinusoidal test signal from FIG. 6 distorted by both a static non-linearity similar to that described above and a dynamic non-linearity with transfer function $y(t) = x(t) + 0.0005 \cdot (x(t) - x(t-td))^2 + 0.0002 \cdot (x(t) - x(t-td))^3.$ The sample rate in this example is 300 Msps and the time delay td is 2 clock cycles. A digital FIR Hilbert filter of 32 taps similar to that described herein was used to generate the quadrature correction. Note that the system substantially eliminates the distortion.

The table below summarizes the correction achieved for each harmonic component for the dynamic non-linearity correction shown in FIG. 7.

| Harmonic Number | Frequency (Hz) | Pre-correction Magnitude (dBc) | Post-correction Magnitude (dBc) | Delta (dB) |
|---|---|---|---|---|
| H2 | 1.40E+08 | −57.1 | −103.5 | 46.5 |
| H3 | 9.00E+07 | −66.5 | −112.5 | 46.1 |
| H4 | 2.00E+07 | −81.7 | −113.7 | 31.9 |
| H5 | 5.00E+07 | −96.8 | −110.8 | 14.0 |
| H6 | 1.20E+08 | −89.2 | −111.7 | 22.5 |
| H7 | 1.10E+08 | −104.2 | −111.4 | 7.2 |
| H8 | 4.00E+07 | −95.6 | −114.6 | 19.0 |
| H9 | 3.00E+07 | −124.2 | −114.0 | −10.2 |
| H10 | 1.00E+08 | −98.8 | −108.7 | 9.9 |
| H11 | 1.30E+08 | −124.0 | −122.6 | −1.3 |
| H12 | 6.00E+07 | −104.2 | −120.9 | 16.6 |

The characteristics of a Hilbert filter that may be used in the processes described herein are provided below. The ideal Hilbert transform of an input signal is realized by filtering with the system function $H(\omega)$ $$H(\omega) = -j \cdot sgn(\omega)$$

This filtering produces a constant 90 degree phase shift and all-pass magnitude frequency response for all input frequencies. The discrete time impulse response of this ideal filter is given by $$h[n] = \begin{cases} \frac{2}{\pi} \frac{\sin^2(\pi \cdot n/2)}{n}, & n \neq 0, \\ 0, & n = 0 \end{cases}$$

Figure 8:
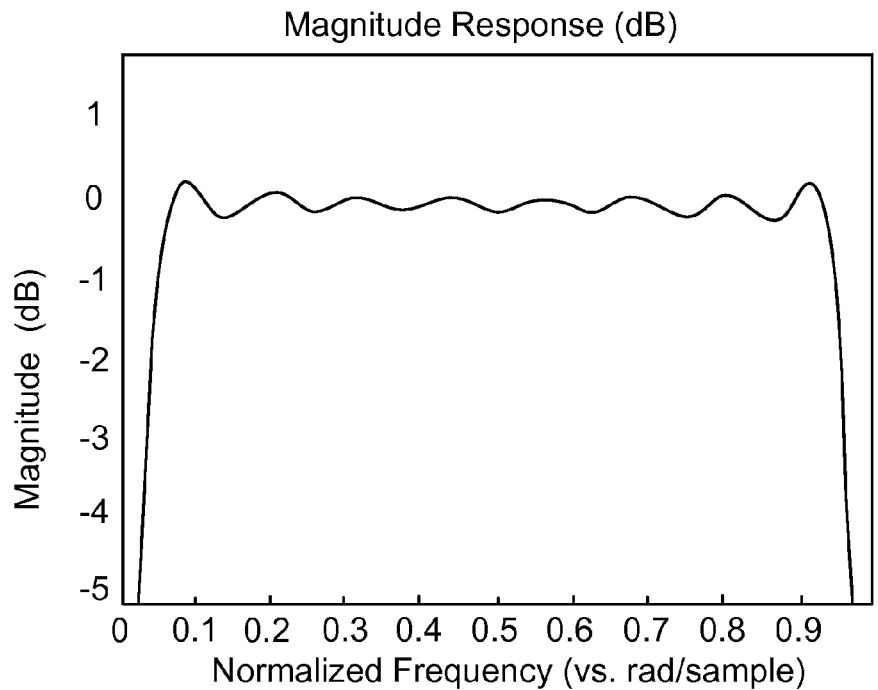
FIG. 8 shows the magnitude response of an example of a filter with 32 taps and anti-symmetric filter structure.

A causal approximation to the above ideal impulse response may be achieved with an FIR filter synthesized with well known design techniques. The approximation results in a bandpass filter approximation with $\pi/2$ phase shift and linear phase term proportional to the pipeline delay of the filter. FIG. 8 shows the magnitude response of an example of this filter with 32 taps and anti-symmetric filter structure.

Figure 9:
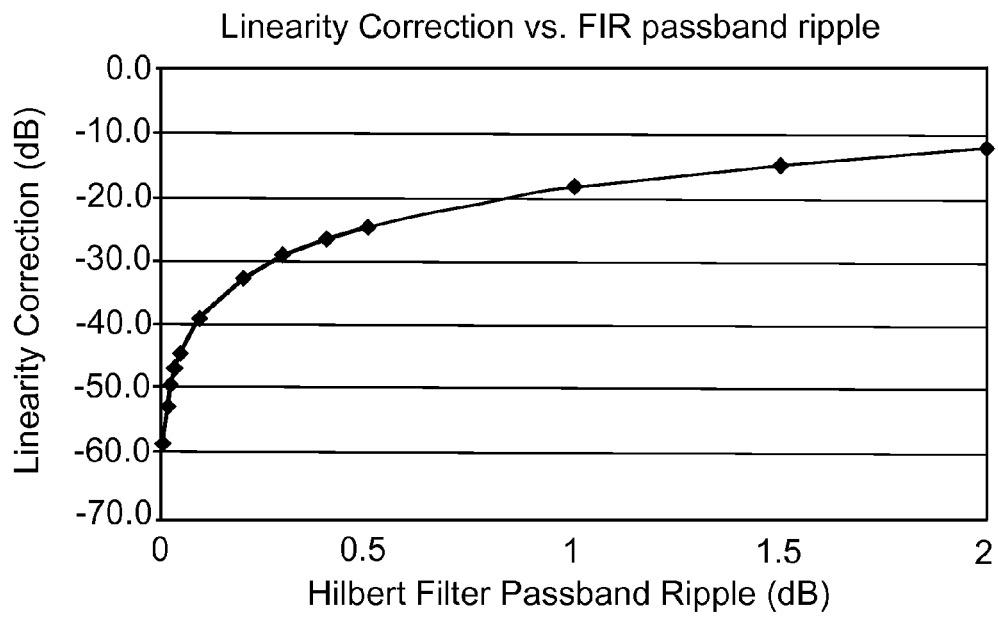
FIG. 9 shows a plot of a possible correction of a given harmonic in decibels vs. the filter passband ripple, also in decibels.

Passband ripple of this FIR filter directly limits the accuracy of the linearity correction because of the error it introduces into the dynamic component synthesized to compensate the harmonic. A least-squares filter design approach yields better passband flatness in the range 10% to 90% of the Nyquist band than an equiripple design approach with the same order. FIG. 9 shows a plot of the possible correction of a given harmonic in decibels vs. the filter passband ripple, also in decibels. A worst case purely dynamic non-linearity is assumed.

The filter passband ripple tolerance is a practical consideration involving a direct tradeoff between FPGA logic resources and correction performance. Over 30 dB of correction can be achieved with a 32 tap Hilbert FIR filter. In practice the design approach described above ensures that measurement accuracy of the calibration test signal distortion will limit the correction and not the compensation hardware.

The process described above for determining, storing and/or using harmonic error correction data, and its various modifications and related processes described herein (hereinafter "the processes"), are not limited to the hardware and software described above. All or part of the processes can be implemented, at least in part, via a computer program product, i.e., a computer program tangibly embodied in an information carrier, such as one or more machine-readable media, for execution by, or to control the operation of, one or more data processing apparatus, e.g., a programmable processor, a computer, multiple computers, and/or programmable logic elements.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The processes described herein are explained in the context of ATE instrumentation for use in production test of semiconductor circuits. However, the processes are not limited to this context. Rather, they are also applicable to other hardware configurations, such as bench (rack mount) instrumentation. For example a signal generator or spectrum analyzer instrument may incorporate linearity correction hardware/software and be calibrated using the processes to improve its dynamic range (e.g., by reducing harmonic distortion in the instrument channel(s)).

Another application of the processes may be made in data converter integrated circuits (ICs). For example, a Hilbert filter could be built into a data converter IC, along with non-volatile memory to implement the I-LUT and Q-LUT, which may be used to implement the processes in order to improve the dynamic range of such an IC.

Elements of different embodiments described herein may be combined to form other embodiments not specifically set forth above. Other embodiments not specifically described herein are also within the scope of the following claims.

What is claimed is:

1. An apparatus comprising:
   circuitry configured to pass a signal in a channel of the apparatus;
   memory storing first and second correction values,
      a first correction value being based on a first version of the signal, the first correction value for use in correcting static non-linearity associated with the channel; and
      a second correction value being based on a second version of the signal, the second correction value for use in correcting dynamic non-linearity associated with the channel; and
   digital signal processing logic configured to use the first correction value, the second correction value, and the signal in order to compensate for harmonic distortion from the channel.

2. The apparatus of claim 1, further comprising a phase shift circuit for shifting a phase of the signal to produce the second version of the signal.

3. The apparatus of claim 2, wherein the phase shift circuit comprises a Hilbert filter, and shifting comprises shifting a phase of the signal by about 90°.

4. The apparatus of claim 1, wherein the circuitry, the memory, and the logic comprise parts of a capture channel of automatic test equipment (ATE), the capture channel for receiving signals from a device under test (DUT).

5. The apparatus of claim 1, wherein the circuitry, the memory, and the logic comprise parts of a source channel of automatic test equipment (ATE), the source channel for providing signals to a device under test (DUT).

6. The apparatus of claim 1, further comprising a first look-up table (LUT) storing the first correction values and a second LUT storing the second correction values;
wherein the first LUT comprises plural first correction values, the plural first correction values for use in correcting for a first N harmonics caused by the static non-linearity; and
wherein the plural first correction values, $d_I(x)$, comprise:

$$d_I(x) = \sum_{n=2}^{N} H_n \cdot \cos(\theta_n - n\phi) \cdot \cos(n \cdot \cos^{-1}(x)),$$

where $H_n$ is a magnitude of an $n^{th}$ harmonic, $\theta_n$ is a phase of the $n^{th}$ harmonic, x is a sample value of a signal in the channel, and $\phi$ is a phase of a fundamental signal that produces harmonics.

7. The apparatus of claim 6, wherein the plural first correction values are configured for correcting aliased harmonics.

8. The apparatus of claim 7, wherein $H_n = |H(f_{nalias})|$, $\theta_n = \angle H(f_{nalias})$ where $$f_{nalias} = nf_0 \bmod \frac{Fs}{2},$$

with $nf_0$ corresponding to an $n^{th}$ direct harmonic, and Fs corresponding to a sampling clock frequency of the channel.

9. The apparatus of claim 7, wherein $H_n = |H(f_{nalias})|$, $\theta_n = -\angle H(f_{nalias})$ where $$f_{nalias} = \frac{Fs}{2} - nf_0 \bmod \frac{Fs}{2},$$

with $nf_0$ corresponding to an n direct harmonic, and Fs corresponding to the sampling clock frequency of the channel.

10. The apparatus of claim 1, further comprising a first look-up table (LUT) storing the first correction values and a second LUT storing the second correction values;
wherein the second LUT comprises plural second correction values, the plural second correction values for use in correcting for a first N harmonics caused by the dynamic non-linearity; and
wherein the plural second correction values, $d_Q(x)$, comprise:

$$d_Q(x) = -\sum_{n=2}^{N} H_n \cdot \sin(\theta_n - n\phi) \cdot \cos(n \cdot \cos^{-1}(x)), \text{ or}$$

$$d_Q(x) = -\sum_{n=2}^{N} H_n \cdot \sin(\theta_n - n\phi) \cdot \sin(n \cdot \sin^{-1}(x))$$

where $H_n$ is a magnitude of an $n^{th}$ harmonic, $\theta_n$ is a phase of the $n^{th}$ harmonic, x is a sample value of a signal in the channel, and $\phi$ is a phase of a fundamental signal that produces harmonics.

11. The apparatus of claim 10, wherein the second first correction values are configured for correcting aliased harmonics.

12. The apparatus of claim 11, wherein $H_n = |H(f_{nalias})|$, $\theta_n = \angle H(f_{nalias})$ where $$f_{nalias} = nf_0 \bmod \frac{Fs}{2},$$

with $nf_0$ corresponding to an $n^{th}$ direct harmonic, and Fs corresponding to a sampling clock frequency.

13. The apparatus of claim 11, wherein $H_n = \mp |H(f_{nalias})|$, $\theta_n = -\angle H(f_{nalias})$ where $$f_{nalias} = \frac{Fs}{2} - nf_0 \bmod \frac{Fs}{2},$$

with $nf_0$ corresponding to an $n^{th}$ direct harmonic, and Fs corresponding to a sampling clock frequency.

14. The apparatus of claim 1, further comprising a switchable filter bank in the channel, the switchable filter bank comprising one or more filters that are switchable into, or out of, the channel, the one or more filters being configured to compensate for harmonic distortion from the channel.

15. The apparatus of claim 1, wherein the digital signal processing logic comprises circuitry to combine the first correction value and the second correction value to produce a sum, and to subtract the sum from the signal, thereby reducing the harmonic distortion.

16. The apparatus of claim 1, wherein the apparatus comprises one of automatic test equipment (ATE), a data converter circuit, a signal generator, and a spectrum analyzer.

17. One or more machine-readable media comprising instructions that are executable to generate correction values that are usable to compensate for harmonic distortion in a channel of an instrument, the instructions for causing one or more processing devices to:
generate first correction values for use in correcting static non-linearity associated with the channel of the instrument;
store the first correction values in memory;

generate second correction values for use in correcting dynamic non-linearity associated with the channel of the instrument; and store the second correction values in memory.

18. The one or more machine-readable media of claim 17, wherein the first correction values are for use in correcting for a first N harmonics caused by the static non-linearity;

wherein the first correction values, $d_I(x)$, comprise:

$$d_I(x) = \sum_{n=2}^{N} H_n \cdot \cos(\theta_n - n\phi) \cdot \cos(n \cdot \cos^{-1}(x)),$$

where $H_n$ is a magnitude of an $n^{th}$ harmonic, $\theta_n$ is a phase of the $n^{th}$ harmonic, x is a sample value of a signal in the channel, and $\phi$ is a phase of a fundamental signal that produces harmonics.

19. The one or more machine-readable media of claim 18, wherein the first correction values are configured for correcting aliased harmonics;

wherein, if a direct harmonic occurs in an odd Nyquist zone of a sampling clock, then $H_n = |H(f_{nalias})|$, $\theta_n = \angle H(f_{nalias})$ where $$f_{nalias} = nf_0 \bmod \frac{Fs}{2},$$

with $nf_0$ corresponding to an $n^{th}$ direct harmonic, and Fs corresponding to a sampling clock frequency; and wherein, if the direct harmonic occurs in an even Nyquist zone of the sampling clock, then $H_n = |H(f_{nalias})|$, $\theta_n = -\angle H(f_{nalias})$ where $$f_{nalias} = \frac{Fs}{2} - nf_0 \bmod \frac{Fs}{2}.$$

20. The one or more machine-readable media of claim 17, wherein the second correction values are for use in correcting for a first N harmonics caused by the dynamic non-linearity; wherein the second correction values, $d_Q(x)$, comprise:

$$d_Q(x) = -\sum_{n=2}^{N} H_n \cdot \sin(\theta_n - n\phi) \cdot \cos(n \cdot \cos^{-1}(x)), \text{ or}$$

$$d_Q(x) = -\sum_{n=2}^{N} H_n \cdot \sin(\theta_n - n\phi) \cdot \sin(n \cdot \sin^{-1}(x))$$

where $H_n$ is a magnitude of an $n^{th}$ harmonic, $\theta_n$ is a phase of the $n^{th}$ harmonic, x is a sample value of a signal in the channel, and $\phi$ is a phase of a fundamental signal that produces harmonics.

21. The one or more machine-readable media of claim 20, wherein the second correction values are configured for correcting aliased harmonics;

wherein, if a direct harmonic occurs in an odd Nyquist zone of a sampling clock, then $H_n = |H(f_{nalias})|$, $\theta_n = \angle H(f_{nalias})$ where $$f_{nalias} = nf_0 \bmod \frac{Fs}{2},$$

with $nf_0$ corresponding to an $n^{th}$ direct harmonic, and Fs corresponding to a sampling clock frequency; and wherein, if a direct harmonic occurs in an even Nyquist zone of the sampling clock, then $H_n = \mp |H(f_{nalias})|$, $\theta_n = -\angle H(f_{nalias})$ where $$f_{nalias} = \frac{Fs}{2} - nf_0 \bmod \frac{Fs}{2}.$$

* * * * *